United States Patent
Takada et al.

(10) Patent No.: US 7,732,790 B2
(45) Date of Patent: Jun. 8, 2010

(54) ION IMPLANTING APPARATUS FOR FORMING ION BEAM GEOMETRY

(75) Inventors: Jitsuo Takada, Kumamoto (JP); Minoru Ikeda, Kumamoto (JP); Satoshi Matsufune, Kumamoto (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 323 days.

(21) Appl. No.: 11/702,677

(22) Filed: Feb. 6, 2007

(65) Prior Publication Data
US 2008/0073585 A1    Mar. 27, 2008

(30) Foreign Application Priority Data
Feb. 23, 2006  (JP)  ............................. 2006-046140
Dec. 22, 2006  (JP)  ............................. 2006-346385

(51) Int. Cl.
G21K 5/04    (2006.01)
(52) U.S. Cl. ............................. 250/492.21; 250/492.22; 250/492.1; 250/492.2
(58) Field of Classification Search .............. 250/491.1, 250/492.2, 492.1, 492.21, 492.3, 396 R, 423 R, 250/492.22, 493.1, 492.23; 438/369, 473, 438/480, 506; 427/523, 526; 216/62, 87
See application file for complete search history.

(56) References Cited

U.S. PATENT DOCUMENTS

| 5,102,498 | A  | * | 4/1992  | Itoh et al. ...................... 216/47 |
| 5,947,053 | A  | * | 9/1999  | Burnham et al. ............ 116/208 |
| 6,544,597 | B2 | * | 4/2003  | Takahashi et al. ........... 427/452 |
| 7,276,287 | B2 | * | 10/2007 | Smith et al. .................. 428/422 |
| 2003/0066975 | A1 | * | 4/2003 | Okada ..................... 250/492.2 |
| 2004/0092396 | A1 | * | 5/2004 | Glazer et al. ................ 502/439 |
| 2005/0276928 | A1 | * | 12/2005 | Okumura et al. ............ 427/446 |
| 2006/0022144 | A1 | * | 2/2006 | Cha ........................... 250/426 |
| 2006/0288934 | A1 | * | 12/2006 | Takahashi et al. ........... 118/715 |

FOREIGN PATENT DOCUMENTS

CN    1329180 A    1/2002

(Continued)

OTHER PUBLICATIONS

Chinese Office Action dated Dec. 25, 2009 with English translation.

*Primary Examiner*—Jack I Berman
*Assistant Examiner*—Nicole Ippolito Rausch
(74) *Attorney, Agent, or Firm*—McGinn Intellectual Property Law Group, PLLC (57) ABSTRACT

An ion implanting apparatus is provided, which prevents a failure of the processing object caused by a scattering of the deposited particles of the ion species on an inner surface of a through hole of a member that forms a beam geometry of an ion beam. Since at least an inner surface of the through hole 222 of the member 220 having a through hole and being capable of forming a beam geometry is coated with a thermal spraying film, unwanted deposition of the ion species on the inner surface of the through hole 222 is inhibited. Moreover, since a deposition film generated on the surface of the thermal spraying film has an unoriented poly-crystalline structure that exhibits extremely higher inter-layer adhesiveness, a failure of the processing object caused by a scattering of the particles peeled-off from the deposition layer is prevented.

20 Claims, 13 Drawing Sheets

FOREIGN PATENT DOCUMENTS

| | | |
|---|---|---|
| JP | 3-269940 | 12/1991 |
| JP | 10-25178 | 1/1998 |
| JP | 11-149898 | 6/1999 |
| JP | 11-283552 | 10/1999 |
| JP | 2002-004027 | 1/2002 |

* cited by examiner

DEPOSITED FILM INCLUDING SELECTIVELY
ORIENTED CARBON ALONG C-AXIS DIRECTION
(SCHEMATIC DIAGRAM OF CRYSTAL STRUCTURE)

FIG. 4

SCHEMATIC DIAGRAM OF UNORIENTED CRYSTAL STRUCTURE OF THERMALLY SPRAYED SILICON

ION IMPLANTING APPARATUS FOR FORMING ION BEAM GEOMETRY

This application is based on Japanese patent application No. 2006-046,140 and 2006-346,385, the contents of which are incorporated hereinto by reference.

BACKGROUND

1. Technical Field

The present invention relates to an ion implanting apparatus that is capable of irradiating an ion beam over a semiconductor wafer to implant ion species, and in particular, relates to an ion implanting apparatus that is capable of forming a beam geometry by passing an ion beam through a through hole of a member.

2. Related Art

Currently, an ion implanting apparatus is utilized for implanting ion species into a semiconductor wafer. Such ion implanting apparatus is described as follows in reference to FIG. 10 and FIG. 11. An ion implanting apparatus 100 shown here includes a main part that comprises an ion gun 110, an aperture member 120, a wafer holding unit 130 or the like, which are linearly arranged.

Figure 10:
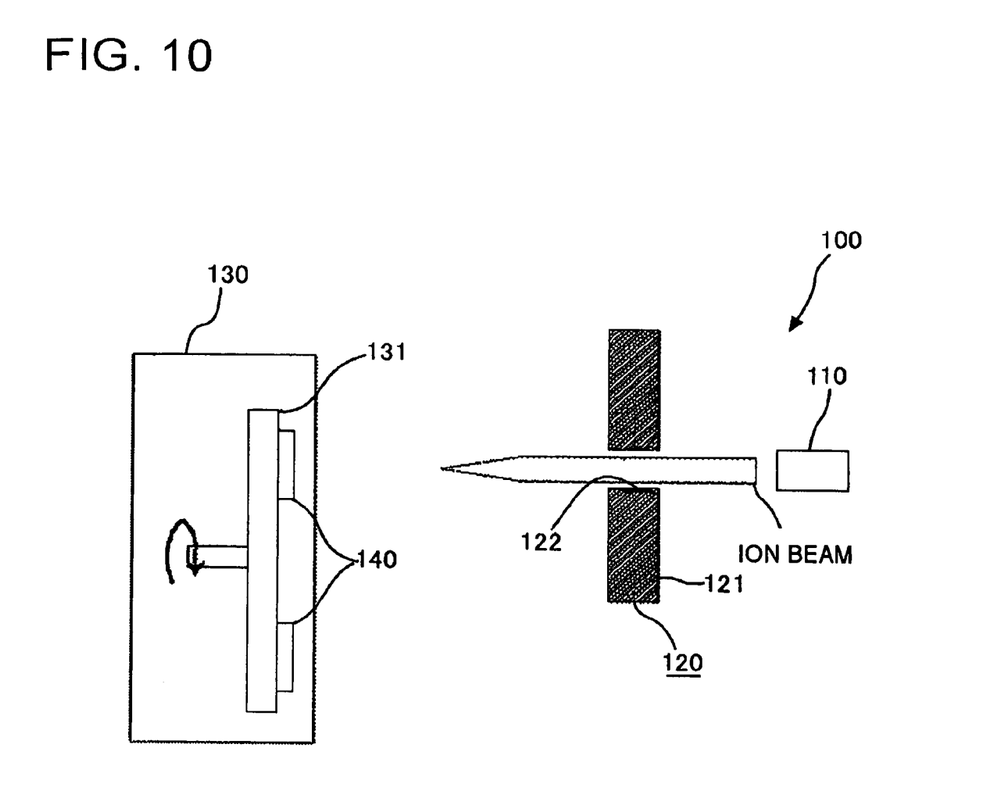
FIG. 10 is a schematic side view, illustrating an internal structure of a conventional ion implanting apparatus.
Figure 11:
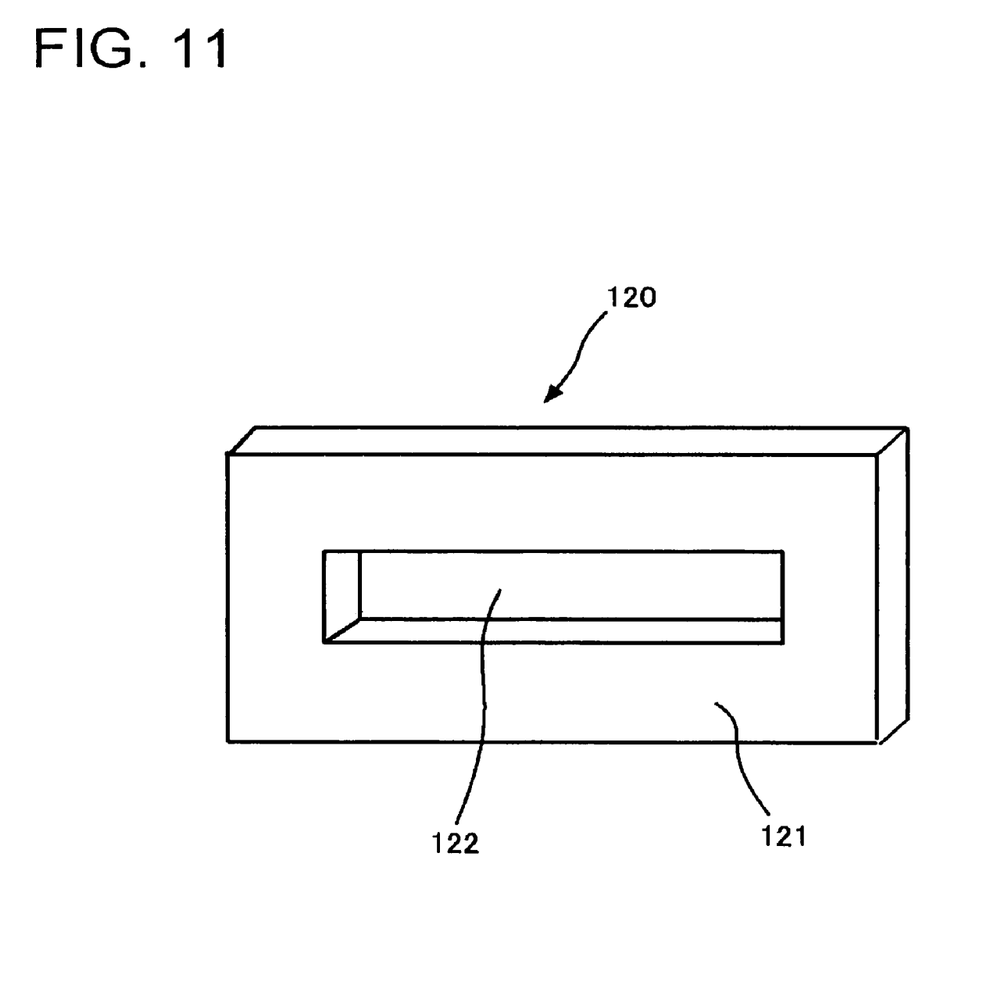
FIG. 11 is a perspective view, illustrating an exterior view of an aperture member.

The ion gun 110 produces ion species supplied from an ion source (not shown) to create an ion beam. The aperture member 120 is formed by, for example, machining carbon graphite, and is provided with a slit-shaped through hole 122 formed in a flat member body 121.

The wafer holding unit 130 includes a rotation stage 131 and a slide mechanism (not shown), and the rotation stage 131 holds a plurality of silicon wafers 140 that are to be processed. The rotation stage 131 revolves a plurality of silicon wafers 140 that are held thereon, and the slide mechanism reciprocates the rotation stage 131 along a vertical direction.

In the ion implanting apparatus 100 having the above-described configuration, an ion beam emitted by the ion gun 110 passes through the through hole 122 of the aperture member 120, so that a beam is shaped to have the corresponding geometry.

A plurality of silicon wafers 140 that are revolved and vertically reciprocated by the wafer holding unit 130 are consecutively exposed over the ion beam having such beam geometry, so that the ion species is equivalently injected over the entire surfaces of a plurality of silicon wafers 140.

The aperture member 120 as described above may alternatively be referred to as, for example, a resolving aperture, a beam aperture, a slit member or the like, and, regardless of the name of the member, the member is composed of a flat member provided with a slit-shaped through hole 122 formed therein, as shown in FIG. 11.

Currently, various proposals for ion implanting apparatuses as described above are made (see, for example, Japanese Patent Laid-Open No. H10-25,178 (1998), Japanese Patent Laid-Open No. H11-149,898 (1999) and Japanese Patent Laid-Open No. H11-283,552 (1999)).

Further, an ion implanting apparatus is also proposed which is configured such that at least a surface of various members located in paths for an ion beam is formed of high purity silicon (not shown). In this ion implanting apparatus, even if particles of contaminants are generated from the members in the paths for the ion beam, the particle is necessarily composed of high purity silicon, and, therefore, a contamination of a silicon wafer can be prevented.

In addition to above, it is disclosed in the related art documents that the above-described high purity silicon may be composed of amorphous silicon deposited on the member surface by a chemical vapor deposition (CVD) process, amorphous silicon deposited by a sputter process, a silicon grown by an epitaxy process or the like (see, for example, Japanese Patent Laid-Open No. H03-269,940 (1991)).

Figure 12:
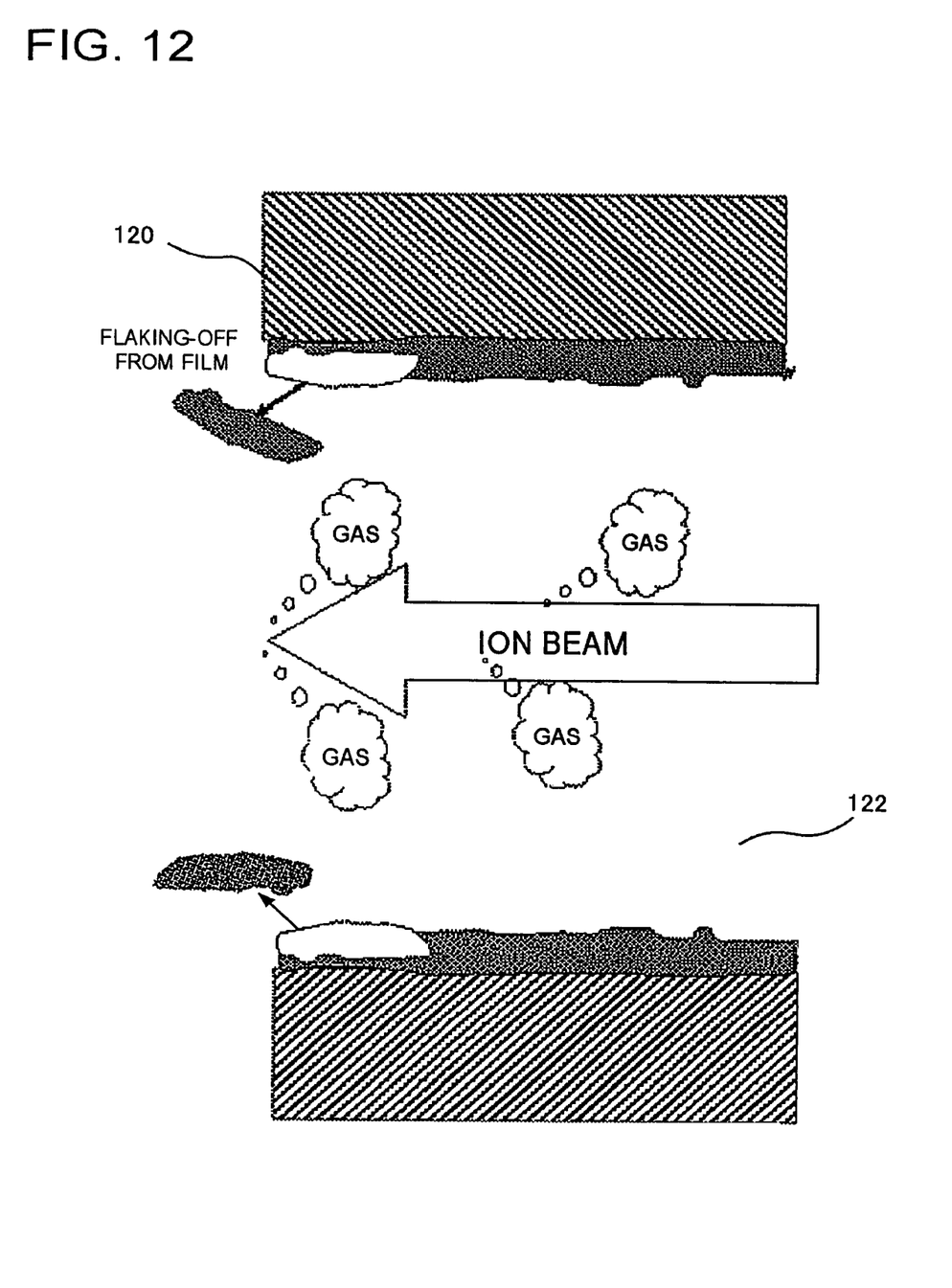
FIG. 12 is a schematic vertical sectional side view, illustrating a condition that the ion species accumulates in and is peeled off from the through hole of the aperture member.

Since a gas of ion species is constantly generated in a periphery of an ion beam in the ion implanting apparatus 100 as described above, the ion species is deposited to form a thin film on an inner surface of the through hole 122 of the aperture member 120, as shown in FIG. 12, during the long term operation.

Figure 13:
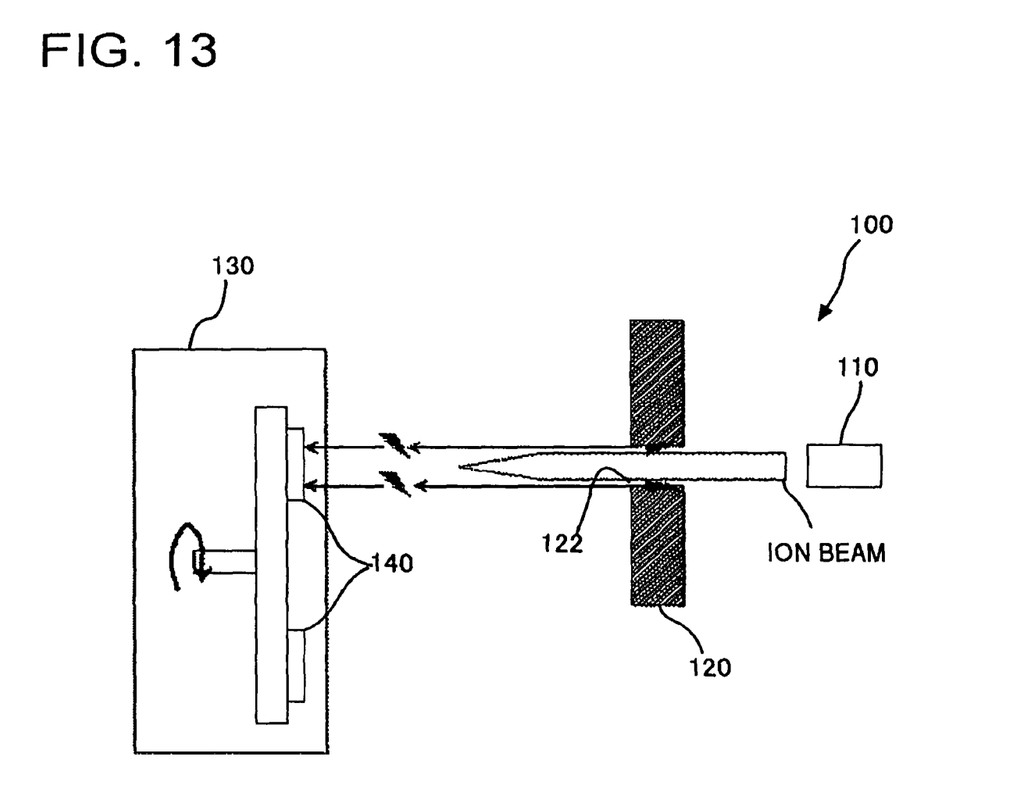
FIG. 13 is a schematic side view, illustrating a condition that contaminants peeled off from the aperture member scatters onto a silicon wafer.

Then, the thin film deposited on the inner surface of the through hole 122 of the aperture member 120 may be peeled off by exposing thereof with the ion beam, and may be eventually scattered to a silicon wafer 140 as a contaminant, as shown in FIG. 13.

In this case, the above-described contaminant may adhere onto a surface of the silicon wafer 140, or may generate damage in the surface of the silicon wafer 140 by a collision of the contaminant, eventually necessitating the disposal of the silicon wafer 140.

For example, a high-current ion implanting apparatus (not shown) or the like utilizes a batch system that retains a large number (e.g., 13 pieces) of silicon wafers 140 therein, and therefore, once a failure is generated as described above, a large number of silicon wafers 140 should be disposed at the same time.

In addition to above, while contaminants generated from the member are composed of silicon in the case of employing the ion implanting apparatus described in the aforementioned Japanese Patent Laid-Open No. H03-269,940, when the contaminants collide with a surface of a silicon wafer, damages may be generated therein. Even if no damage is generated, the presence of contaminants of silicon adhered onto the surface of the silicon wafer may cause a failure in the later semiconductor process.

SUMMARY OF THE INVENTION

According to one aspect of the present invention, there is provided an ion implanting apparatus, which is capable of forming a beam geometry by passing an ion beam through a through hole of a member, wherein at least an inner surface of the through hole of the member is coated with a thermal spraying film. Such configuration provides an adsorption of ion species of the ion beam on the porous thermal spraying film of the member, and an unoriented poly-crystalline structure for a deposition layer generated on the inner surface of the through hole in the unoriented poly-crystalline structure of the member.

According to another aspect of the present invention, there is provided an ion implanting apparatus, which is capable of forming a beam geometry by passing an ion beam through a through hole of a member, wherein at least an inner surface of the through hole of the member is formed to be porous. Such configuration provides an adsorption of the ion species of the ion beam on a porous inner surface of the through hole of the member or the like.

According to yet other aspect of the present invention, there is provided an ion implanting apparatus, which is capable of forming a beam geometry by passing an ion beam through a through hole of a member, wherein at least an inner surface of the through hole of the member is formed have an unoriented poly-crystalline structure. Such configuration provides an unoriented poly-crystalline structure for a deposition layer generated on the inner surface of the through hole in the unoriented poly-crystalline structure of the member.

In addition to above, the "member that forms a beam geometry" according to the present invention may be satisfied if it serves as forming a beam geometry of an ion beam with an aid of a through hole, and more specifically, a typical member that forms a beam geometry may be achieved by having various types of structures of, for example, a flat plate provided with a through hole formed therein, a cylindrical member provided with a through hole formed therein, a plurality of boards combined so as to form a through hole therein, or the like.

In addition, the term "porous" used in the present invention describes a condition in which a plurality of pores are formed in a predetermined range from at least an outer surface to an inside thereof. The term "porous film" means a film having a predetermined film thickness and being provided with a plurality of pores formed in the interior therein.

Further, such "porous" indicates a structure, in which, for example, a plurality of concave portions are formed on the surface thereof and a plurality of pores are formed in the interior thereof, and at least a portion of a plurality of the concave portions connect with at least some of a plurality of the pores, and at least some of the plurality of pores mutually connect.

Since at least an inner surface of the through hole of the above-described member is coated with a thermal spraying film or at least an inner surface of the through hole of the member having a through hole and being capable of forming a beam geometry is formed to be porous in the ion implanting apparatus according to the present invention to provide a suitable adsorption of the ion species of the ion beam on a porous inner surface of the through hole of the member or the like, unwanted generation of the deposition layer on the inner surface of the through hole is inhibited and a failure of the processing object caused by a scattering of the particles peeled-off from the deposition layer is prevented.

Further, since at least an inner surface of the through hole of the above-described member is coated with a thermal spraying film or at least the inner surface of the through hole of the above-described member is formed to have unoriented poly-crystalline structure in the ion implanting apparatus according to the present invention to provide a deposition film generated on the inner surface in the through hole of the member to have unoriented poly-crystalline structure that exhibits extremely high inter-layer adhesiveness, a failure of the processing object caused by a scattering of the particles peeled-off from the deposition layer is prevented.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An embodiment of the present invention will be described as follows in reference to FIG. 1 to FIG. 6. In the following description, an identical element appeared in the above descriptions of the related art is referred to as the identical name, and a detailed description is not presented. An ion implanting apparatus 200 of the present embodiment includes a main part that comprises an ion gun 210, an aperture member 220, a wafer holding unit 230 or the like, and the ion gun 210 is capable of emitting ion species supplied from an ion source (not shown) to create an ion beam.

Figure 1:
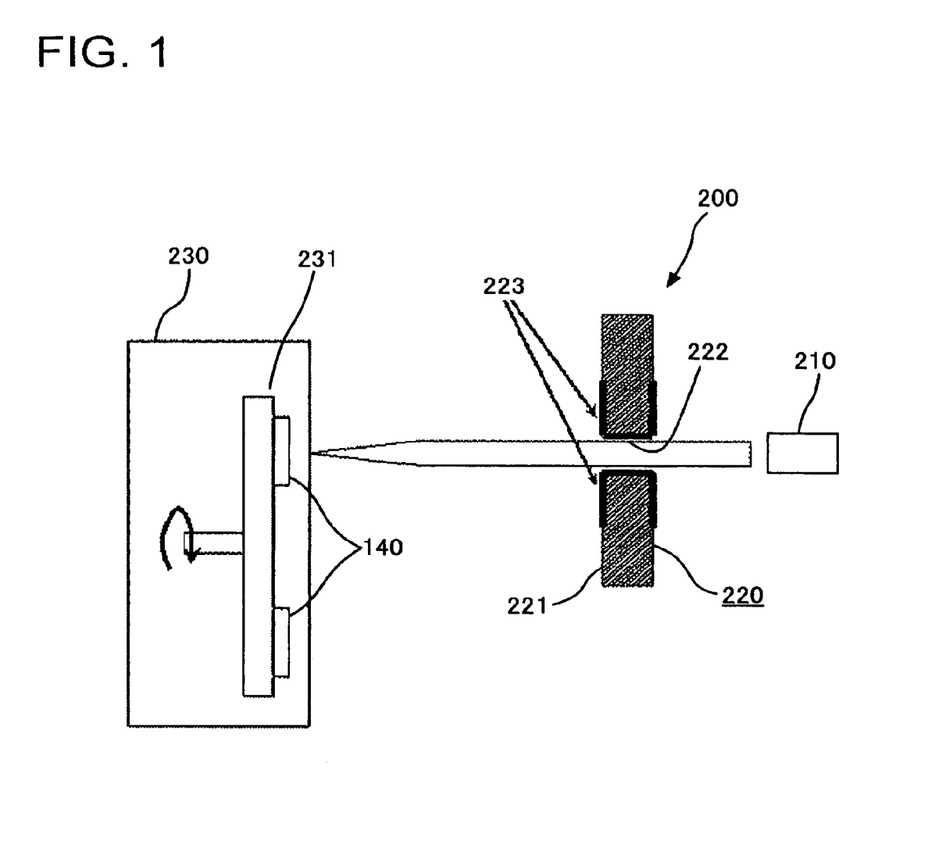
FIG. 1 is a schematic side view, illustrating an internal structure of an ion implanting apparatus of an embodiment according to the present invention.

The wafer holding unit 230 comprises a rotation stage 231 and a slide mechanism (not shown). The rotation stage 231 is capable of revolving a plurality of silicon wafers 140 that are retained thereon, and the side mechanism is capable of reciprocating the rotation stage 231 in a vertical direction or the like.

The aperture member 220 has a flat member body 221, and the member body 221 is formed by, for example, machining carbon graphite. Such a member body 221 is provided with a slit-shaped through hole 222 formed therein, and an inner surface of such through hole 222 and a front and a rear surface of an outer surface thereof are coated with a coating film 223 that is a porous film.

Figure 2A:
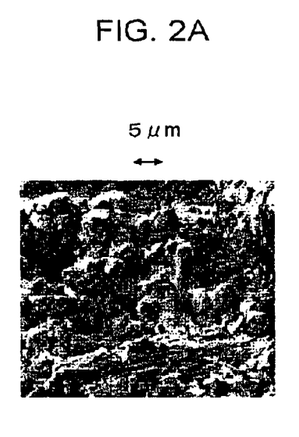
FIGS. 2A to 2C are electron microscope photographs, showing conditions of the observed coating film that were experimentally produced by a thermal spraying of silicon.
Figure 2B:
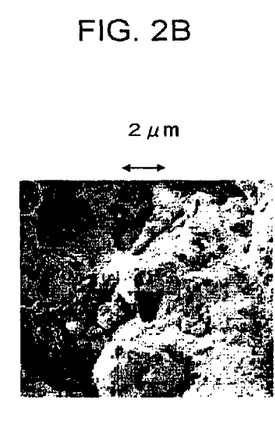
Figure 2C:
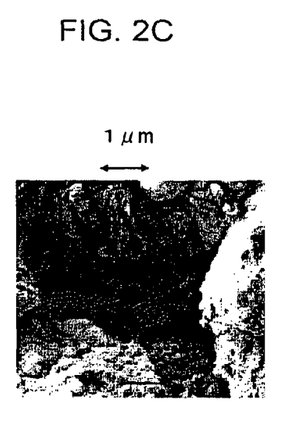

Such a coating film 223 is formed to have a thermal spraying film thickness of about 150 (μm) by, for example, a thermal spraying of silicon. As shown in FIGS. 2A to 2C, the surface thereof is formed to have a porous rough surface with random concave and convex portions of not larger than several micrometers.

In the more detail, a number of concave portions and convex portions are formed in the surface of the above-described coating film 223, and a number of pores are formed in the interior thereof. At least some of the larger number of concave portions connect with at least some of the larger number of pores, and at least some of the larger number of pores mutually connect.

Further, the concave portions, the convex portions and the pores of the coating film 223 are not influential in forming the beam geometry, and are formed to have dimensions of not larger than several micrometers, which are adopted for adsorbing ion species. In addition to above, FIGS. 2A to 2C are electron microscope photographs, showing conditions of the observed coating film 223 that were experimentally produced by a thermal spraying of silicon.

Figure 3:
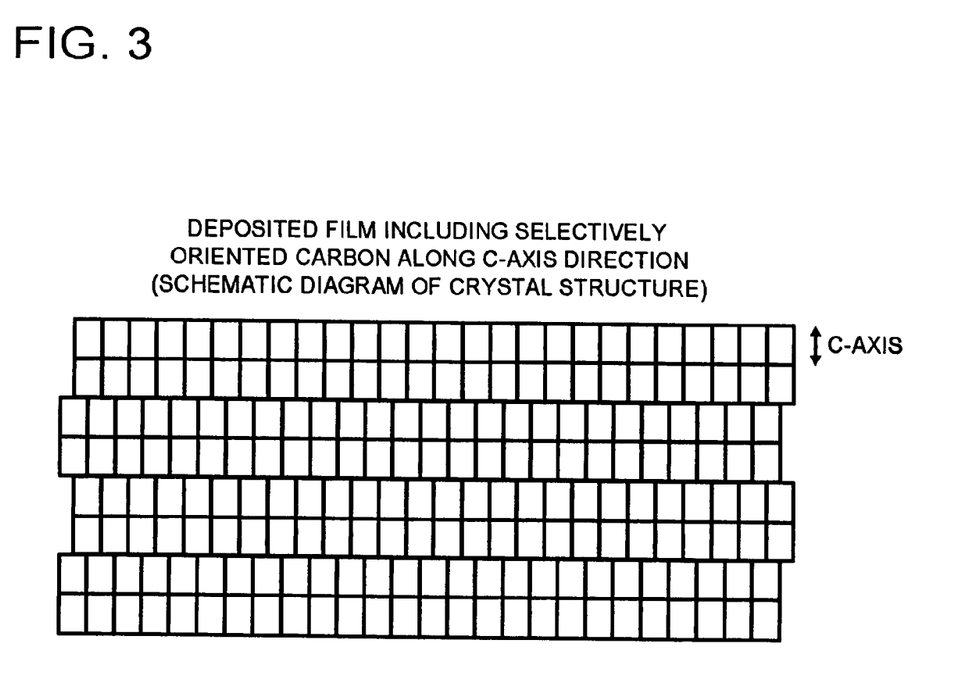
FIG. 3 is a schematic diagram, illustrating an oriented poly-crystalline structure of carbon graphite.
Figure 4:
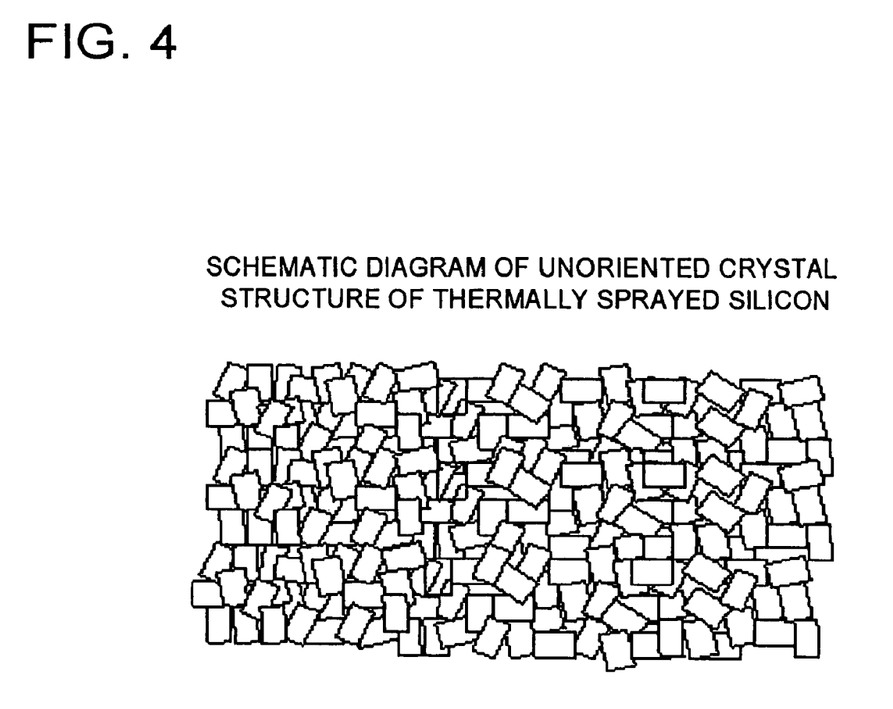
FIG. 4 is a schematic diagram, illustrating an unoriented poly-crystalline structure of a coating film obtained by a thermal spraying of silicon.

In addition to above, the member body 221 composed of carbon graphite is formed to have an oriented poly-crystalline structure, as shown in FIG. 3. On the other hand, the coating film 223 that is deposited on such member body 221 by a thermal spraying of silicon is formed to have an unoriented poly-crystalline structure, as shown in FIG. 4.

In the configuration as described above, in the ion implanting apparatus 200 of the present embodiment, an ion beam emitted by the ion gun 210 passes through the through hole 222 of the aperture member 220, so that a beam is shaped to have the corresponding geometry.

A plurality of silicon wafers 140 that are revolved and vertically reciprocated by the wafer holding unit 230 are consecutively exposed over the ion beam having such beam geometry, so that the ion species is equivalently injected over an entire surface of a plurality of silicon wafers 140.

Figure 5:
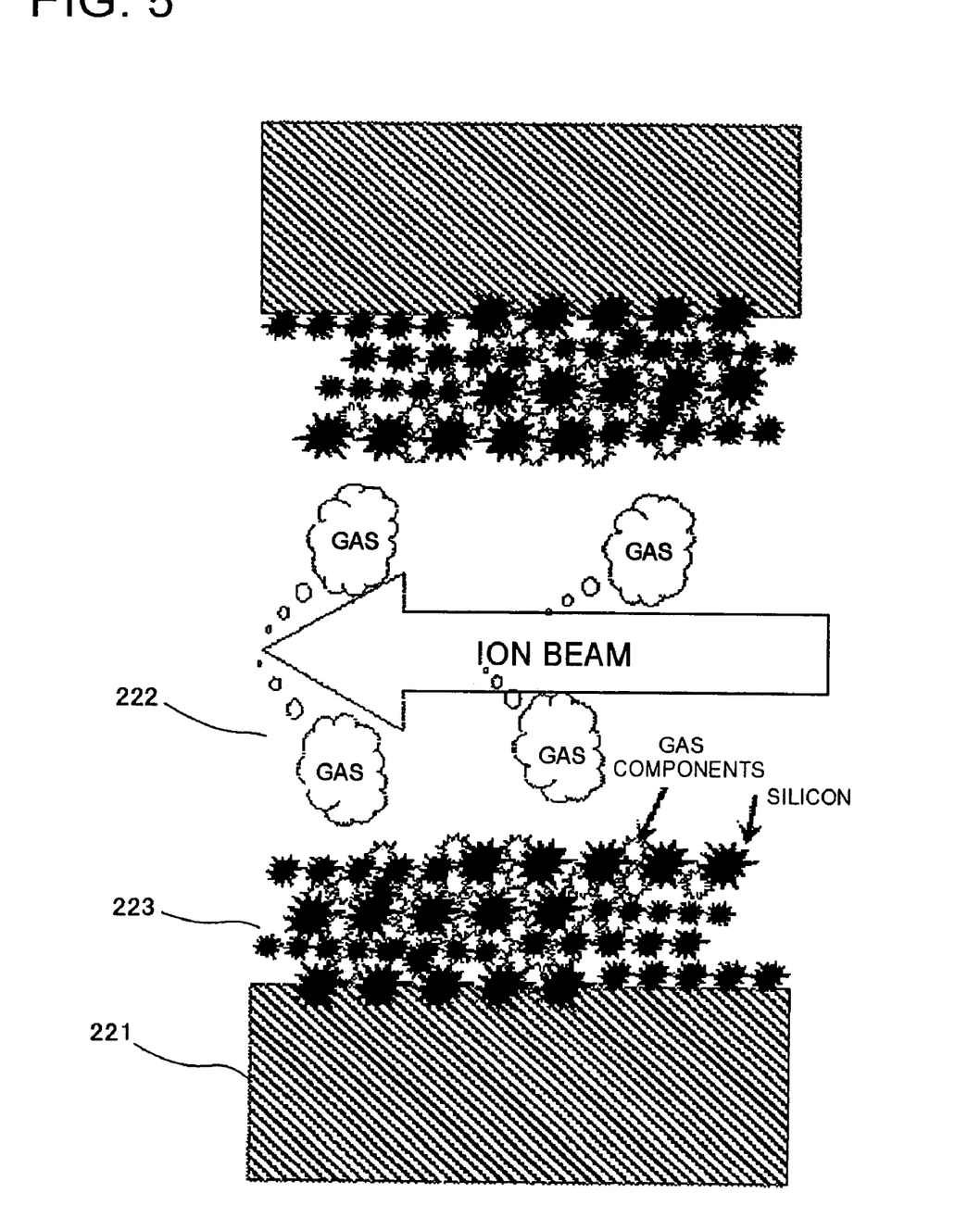
FIG. 5 is a schematic vertical sectional side view, illustrating a condition that ion species is adsorbed by a coating film.

Since the inner surface and the outer surface of the through hole 222 of the aperture member 220 are coated with the porous coating film 223 in the ion implanting apparatus 200 of the present embodiment, a gas of the ion species that is constantly generated around the ion beam is adsorbed by the porous coating film 223, as shown in FIG. 5.

Therefore, even if the operation is continued for longer periods of time, a deposition of the ion species on the inner surface of the through hole 222 or the like scarcely occurs, and a failure of the silicon wafer 140 caused by a scattering of the deposited particles flaked off can be well prevented.

Figure 6:
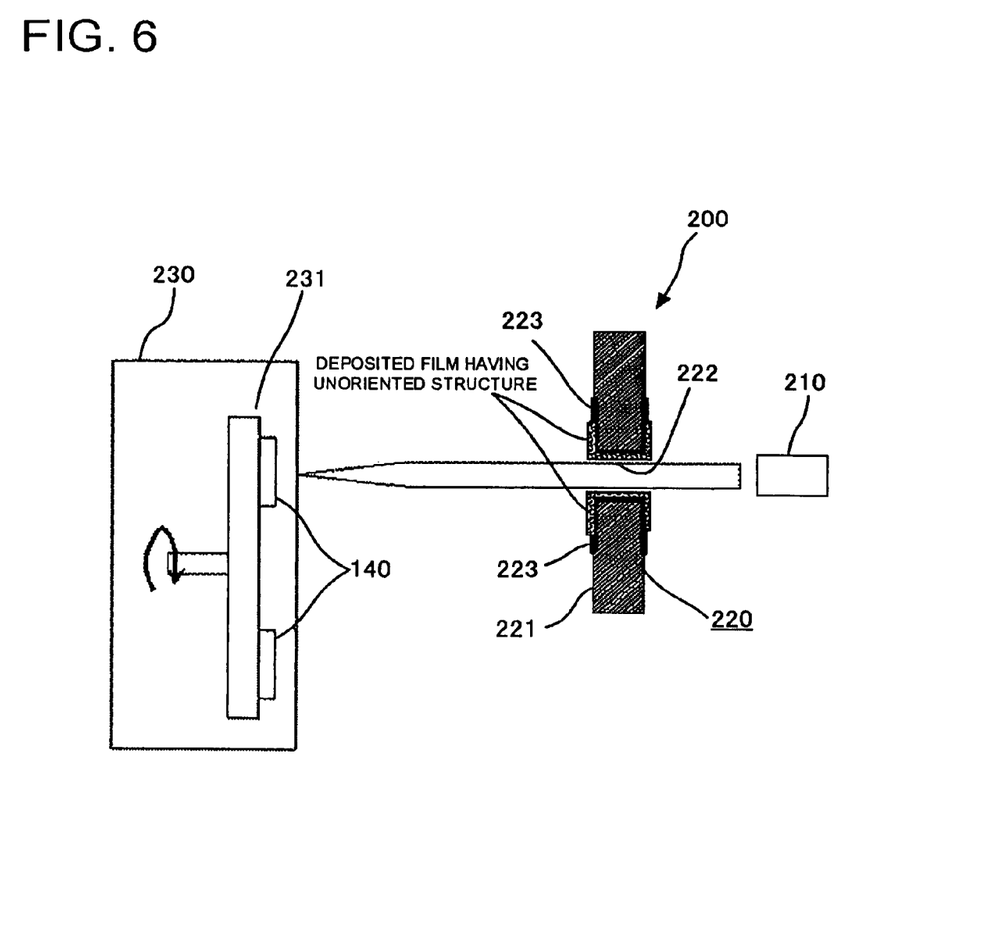
FIG. 6 is a schematic diagram, illustrating a condition that a deposition layer is generated on the experimentally produced aperture member.

Moreover, since the coating film 223 has the unoriented poly-crystalline structure, the deposition layer disposed on the surface thereof generated by ion species has an unoriented poly-crystalline structure, as shown in FIG. 6. As described above, the deposition layer having the unoriented poly-crystalline structure exhibits extremely high inter-layer adhesiveness, as compared with the conventional deposited layer. Thus, flaking off from the deposition layer can be well prevented.

When the aperture member 220 as described above is manufactured, the member body 221 having the through hole 222 of the geometry that corresponds to the beam geometry formed therein is preferably formed by machining carbon graphite or the like, and the inner surface of the through hole 222 of such member body 221 is preferably coated with a porous coating film 223 by a thermal spraying process.

In addition to above, when the present inventors experimentally produced the actual ion implanting apparatus 200 as described above and experiments were performed, it was confirmed that number of particles generated on the surface of the silicon wafer 140 was reduced to about one-tenth of that found in the conventional technologies. In the experiment, number of particles adhered onto the surface of the silicon wafers 140 and number of scratches that are considered to be generated by striking the particles thereto were counted.

In addition, an aperture member, which was formed by the present inventors by machining carbon graphite and had a roughened inner surface of a through hole of a member body roughened by a blast treatment, was experimentally produced (not shown), and it was found that advantageous effects as described above were not achieved by employing the aperture member having such configuration. It is considered that this is because, although the surface is roughened by such blast treatment, the inside thereof is not porosified by such blast treatment, and therefore the ion species can not be well adsorbed.

Further, it is considered that another reason is that, since the member body formed by machining carbon graphite or the like has an oriented poly-crystalline structure as discussed later in detail, the deposition layer generated thereon has also the oriented poly-crystalline structure having lower inter-layer adhesiveness.

In addition, the above-described Japanese Patent Laid-Open No. H10-25,178 discloses that a coating film composed of carbon is formed on a surface of an aperture member by carbonization of a thermosetting resin impregnated into the aperture member or the like.

However, the present inventors have identified that, since the thus-formed coating film is not porous and is formed to have the oriented poly-crystalline structure, the advantageous effects as described above are not obtained.

Here, advantageous effects obtainable by employing the crystal structure as described above will be described as follows. The present inventors have investigated a flaking-off mechanism of a thin film deposited on an inner surface of a through hole of an aperture member during ion beam irradiation, by direct observation using a scanning electron microscope (SEM) and by a crystal structure analysis employing X-ray diffraction (XRD) method.

Figure 7:
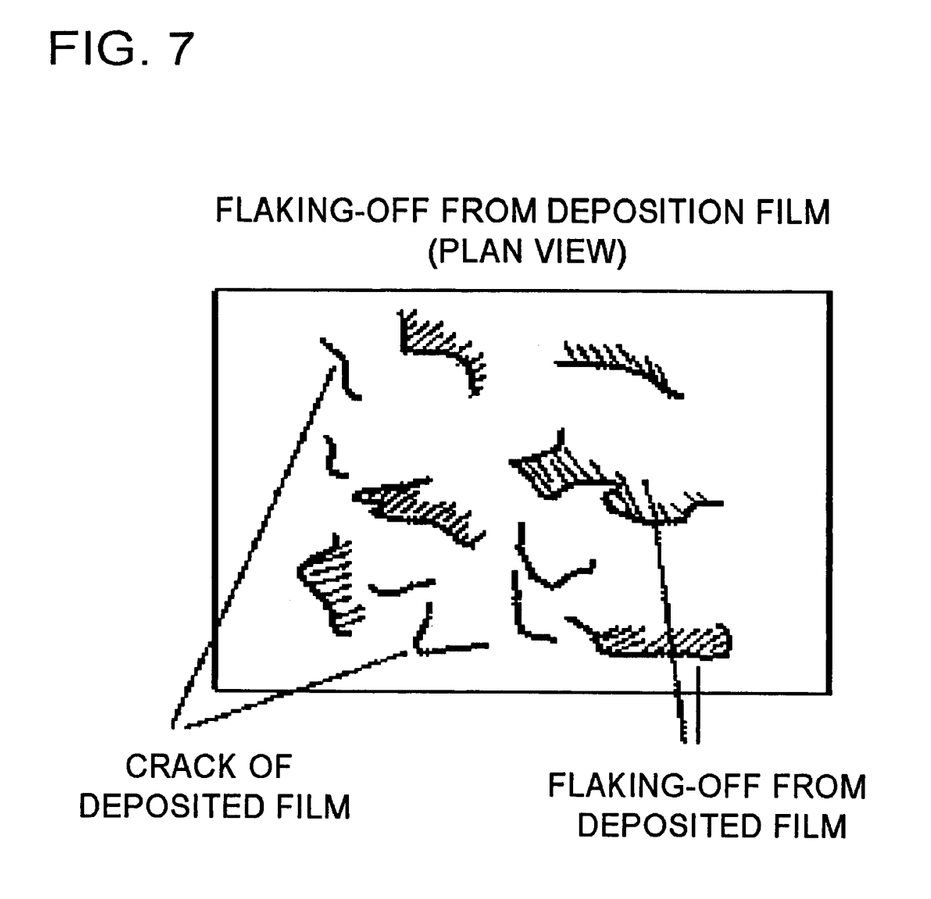
FIG. 7 is a schematic diagram, illustrating a surface condition of the deposition layer on the experimentally produced conventional aperture member.

When the surface of the thin film deposited on the inner surface of the through hole of the aperture member having a conventional structure was observed by enlarging the image with a scanning electron microscope, surface conditions of being cracked or almost causing flaking-off were confirmed, as shown in FIG. 7.

Figure 8:
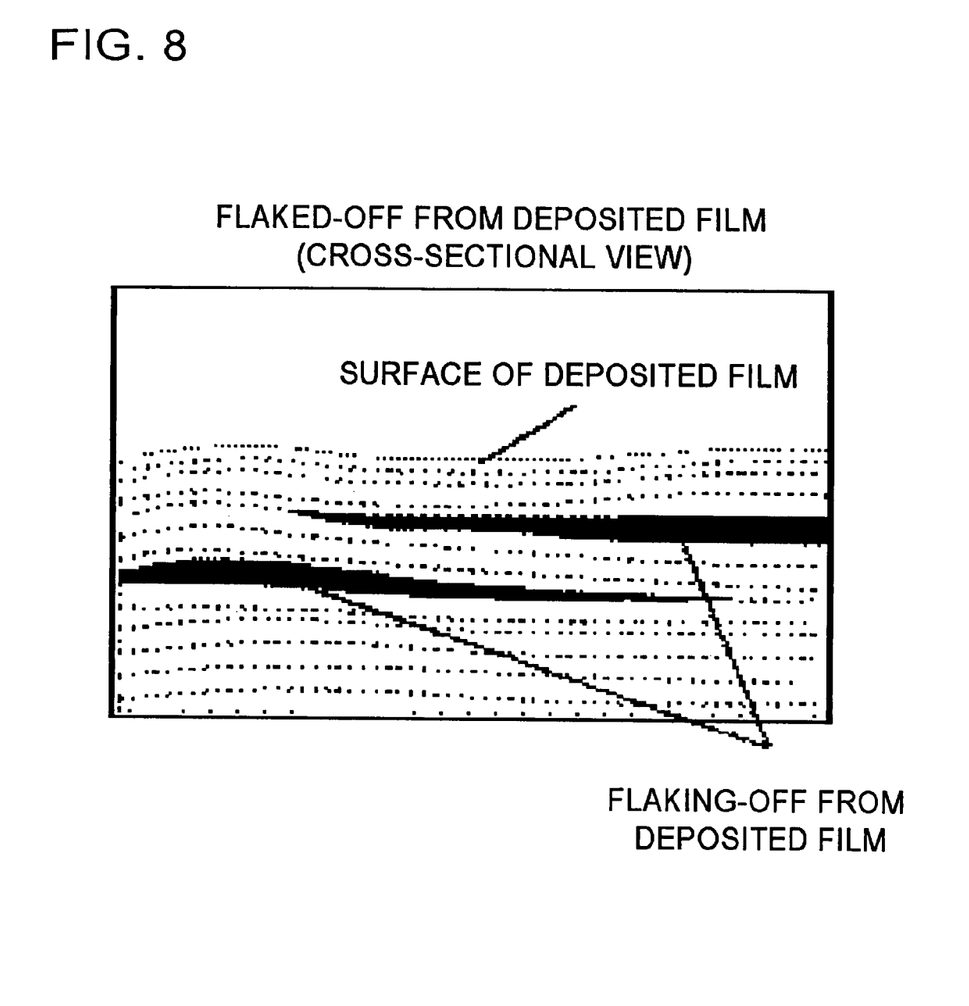
FIG. 8 is a schematic diagram, illustrating a condition of the deposition layer being peeled-off.

Further, when the cross sections of the deposited thin film was observed by enlarging the image with a scanning electron microscope, it was confirmed that the film was deposited to be composed of layers and the film had peeled portions between the layers, as shown in FIG. 8.

Further, a crystal structure analysis of the deposited thin film was performed by X-ray diffraction method, and it was found from the analysis that a crystal structure of carbon graphite was C-axis oriented. A schematic representation of such condition presents that a crystal structure having C-axis orientation along a direction normal to the deposited surface is estimated, as shown in FIG. 3.

Figure 9:
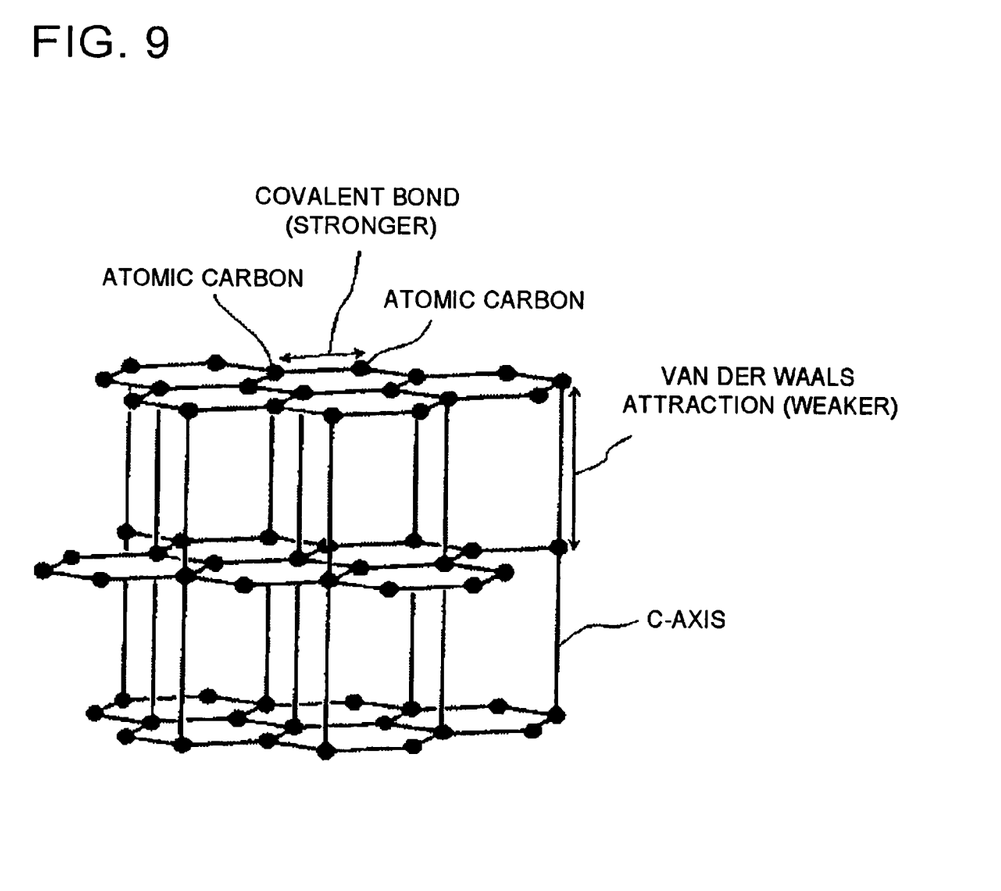
FIG. 9 is a schematic diagram, illustrating a crystal structure of carbon.

FIG. 9 represents an enlarged view of such crystal structure. While the deposited thin film has the crystal structure having C-axis orientation, longer carbon interatomic distance between the layers of 3.40 angstroms is presented in such structure (carbon interatomic distance in the layer plane of 1.42 angstroms), and such structure provides a condition that a layer weakly attracts another layer with a van der Waals attraction, and thus the structure exhibits an easy peeling along the layer direction.

In particular, thicker deposition layers are formed by conducting repeated depositions of the film. A stress exerted onto the layer (or layer boundary) is increased, so that film pieces are easily flaked off. Conditions of causing a crack, peeling or flaking-off of the deposition layer as shown in FIG. 8 support the above-described estimation.

Then, the present inventors investigated that an aperture member having a coating film deposited on a member body composed of carbon graphite is incorporated into an ion implanting apparatus by a thermal spraying of silicon, and then an ion beam of ion species required for the wafer was irradiated, as described above.

Then, it was confirmed that a film having an unoriented poly-crystalline structure is deposited and adhered on the surface of the through hole in the aperture member in every ion implanting operation. The deposition layer having such unoriented poly-crystalline structure exhibits extremely physically higher adhesiveness between the layer, as compared with the deposition layer having the oriented poly-crystalline structure deposited by a conventional technology. Thus, it was confirmed that the aperture member with the coating film of the unoriented poly-crystalline structure deposited thereon by a thermal spraying of silicon provides a prevention for a flaking-off of the deposition layer.

In addition to above, while the deposition layer is composed of crystal of carbon as described above, carbon is not contained in ion species. Thus, it can be estimated that the deposited layer is formed of carbon and ion species, which are precipitated from the aperture member by an exposure to ion beam.

It should be noted that the present invention is not particularly limited to the present embodiment, and various types of modifications are allowed without departing from the scope and the spirit of the present invention. For example, while it is illustrated that the coating film 223 is composed of silicon in the above-described configuration, the coating film may alternatively be formed of tungsten.

It is apparent that the present invention is not limited to the above embodiment, and may be modified and changed without departing from the scope and spirit of the invention.

What is claimed is:

1. An ion implanting apparatus, comprising:
   a member comprising a through hole through which an ion beam is passed to form a beam geometry,
   wherein at least an inner surface of said through hole of said member comprises an unoriented poly-crystalline structure.

2. The ion implanting apparatus according to claim 1, wherein at least said inner surface of said through hole of said member is coated with a thermal spraying film.

3. The ion implanting apparatus according to claim 1, wherein said thermal spraying film comprises silicon.

4. The ion implanting apparatus according to claim 1, wherein said thermal spraying film comprises tungsten.

5. The ion implanting apparatus according to claim 2, wherein said thermal spraying film has a thickness of about 150 μm.

6. The ion implanting apparatus according to claim 2, wherein said thermal spraying film comprises said unoriented poly-crystalline structure.

7. The ion implanting apparatus according to claim 2, wherein said thermal spraying film comprises a porous film.

8. The ion implanting apparatus according to claim 1, wherein at least the inner surface of said through hole of said member is coated with a coating film having an unoriented poly-crystalline structure.

9. The ion implanting apparatus according to claim 1, wherein said member comprises an oriented poly-crystalline structure, and
   wherein at least the inner surface of said through hole of said member is coated with a coating film having an unoriented poly-crystalline structure.

10. The ion implanting apparatus according to claim 1, wherein said member comprises carbon.

11. An ion implanting apparatus, comprising:
    a member comprising a through hole through which an ion beam is passed to form a beam geometry,
    wherein at least an inner surface of said through hole of said member is porous.

12. The ion implanting apparatus according to claim 11, wherein at least the inner surface of said through hole of said member is coated with a porous film.

13. The ion implanting apparatus according to claim 12, wherein said porous film comprises:
    a surface comprising a plurality of concave portions; and
    an interior comprising a plurality of pores,
    wherein at least a portion of said plurality of concave portions connect with at least a portion of said plurality of pores, and
    wherein at least a portion of said plurality of pores mutually connect.

14. The ion implanting apparatus according to claim 13, wherein said plurality of concave portions and said plurality of pores are not influential in forming said beam geometry, and are formed to have dimensions that are adopted for adsorbing ion species.

15. The ion implanting apparatus according to claim 13, wherein said plurality of concave portions have a thickness less than or equal to 5 μm.

16. The ion implanting apparatus according to claim 12, wherein said porous film comprises a coating film.

17. The ion implanting apparatus according to claim 16, wherein said coating film comprises a thermal spraying film.

18. The ion implanting apparatus according to claim 17, wherein said thermal spraying film comprises silicon.

19. The ion implanting apparatus according to claim 17, wherein said thermal spraying film comprises tungsten.

20. The ion implanting apparatus according to claim 11, wherein at least an inner surface of said through hole of said member comprises an unoriented poly-crystalline structure.

* * * * *